United States Patent [19]
Ajit

[11] Patent Number: 5,783,474
[45] Date of Patent: Jul. 21, 1998

[54] REDUCED MASK PROCESS FOR MANUFACTURE OF MOS GATED DEVICES USING DOPANT-ENHANCED-OXIDATION OF SEMICONDUCTOR

[75] Inventor: Janardhanan S. Ajit, Redondo Beach, Calif.

[73] Assignee: International Rectifier Corporation, El Segundo, Calif.

[21] Appl. No.: 570,517

[22] Filed: Dec. 11, 1995

Related U.S. Application Data

[63] Continuation-in-part of Ser. No. 390,099, Feb. 17, 1995, Pat. No. 5,474,946.

[51] Int. Cl.[6] ............................................. H01L 21/265
[52] U.S. Cl. ..................................... 438/279; 438/135
[58] Field of Search ..................... 437/41 RBP, 41 DM, 437/40 DM, 29, 6, 979, 27, 28, 30; 257/335, 336, 337, 338, 339, 340, 341, 342, 343; 148/DIG. 163

[56] References Cited

U.S. PATENT DOCUMENTS

| | | | |
|---|---|---|---|
| 4,716,126 | 12/1987 | Cogan | 437/41 DM |
| 4,774,198 | 9/1988 | Contiero et al. | 437/29 |
| 4,810,665 | 3/1989 | Chang et al. | 437/41 DM |
| 5,141,883 | 8/1992 | Ferla et al. | 437/29 |
| 5,164,327 | 11/1992 | Maruyama | 437/29 |
| 5,187,117 | 2/1993 | Zommer | 437/30 |
| 5,465,000 | 11/1995 | Williams | 257/335 |

*Primary Examiner*—Brian Dutton
*Attorney, Agent, or Firm*—Ostrolenk, Faber, Gerb & Soffen, LLP

[57] ABSTRACT

A process for forming a MOS gated device in which an oxide layer grown on a silicon surface is first patterned to form windows for implantation of P++ regions. Following implantation of the P++ regions, the oxide is completely etched off, and a thermal oxide layer is grown on the wafer surface. Since oxide grows thicker over the highly doped P++ region, the result is a pattern of thick and thin oxide layers atop the silicon surface. Polysilicon is then patterned atop the oxide layer with a critical alignment step to the thin oxide layers in the process. Boron is implanted through both the thick and thin regions of the oxide which are exposed by the polysilicon mask to form P type base regions and P type guard rings in the silicon. Arsenic is thereafter implanted at an energy at which arsenic atoms significantly penetrate only the thin oxide exposed by the polysilicon to form self-aligned source regions in the P type base regions previously formed. A contact opening mask which is critically aligned to the polysilicon mask forms openings for making contact to the silicon. The device is completed using non-critical alignment masking steps. Additional embodiments with modified process sequences are also disclosed.

25 Claims, 14 Drawing Sheets

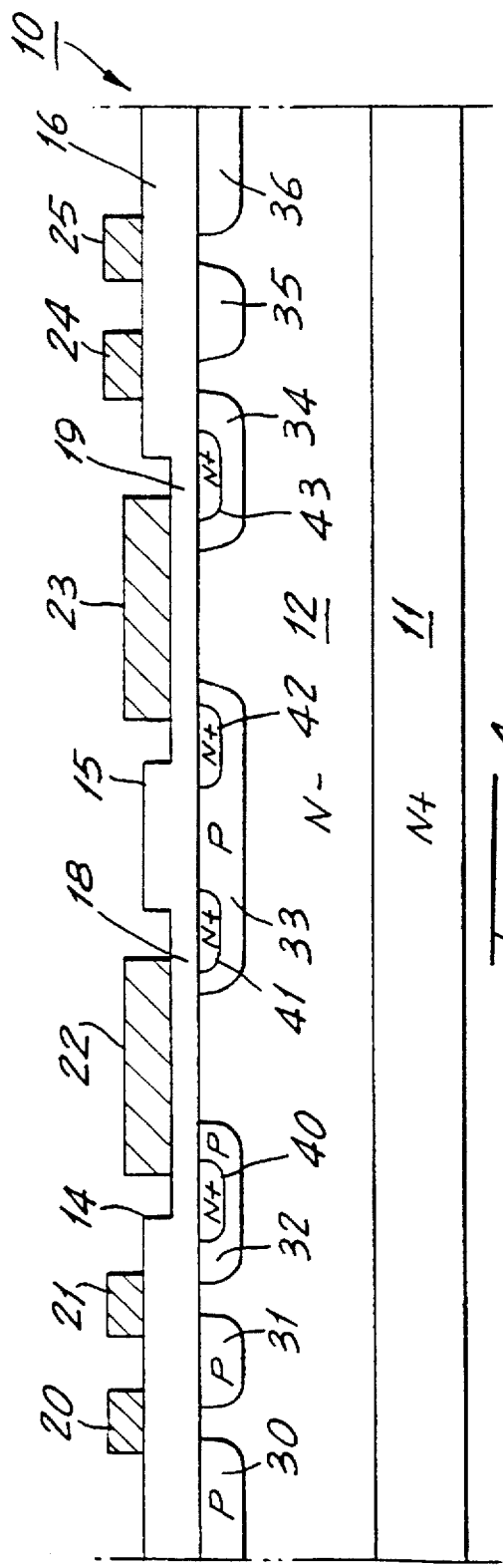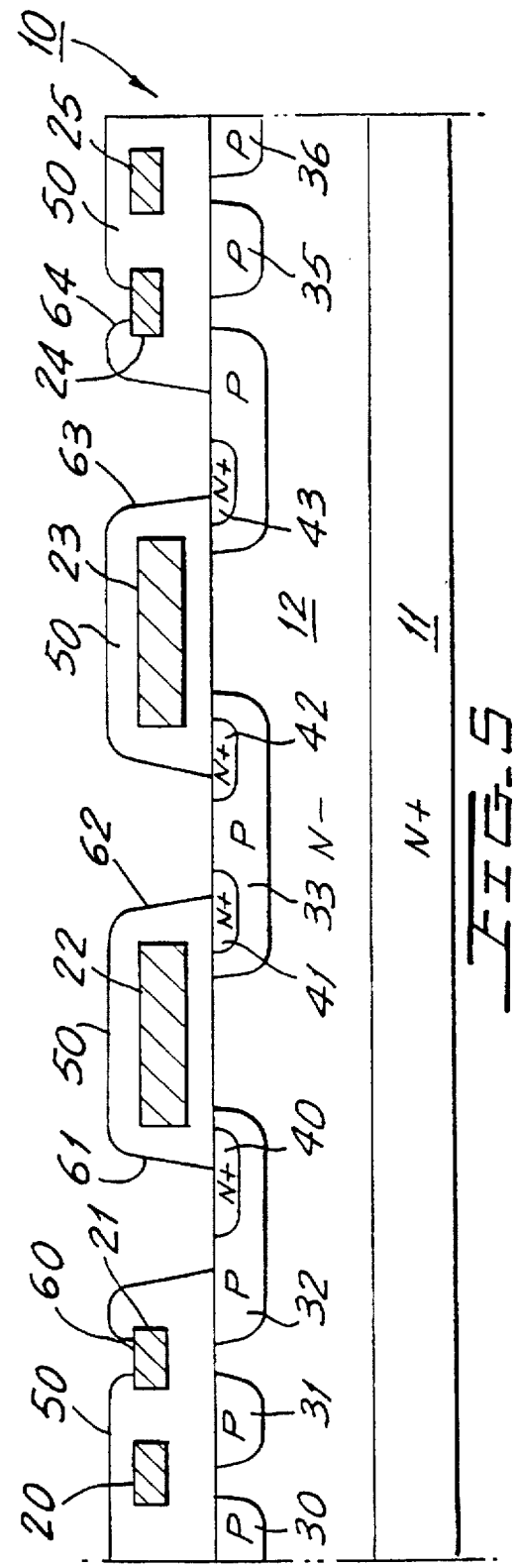

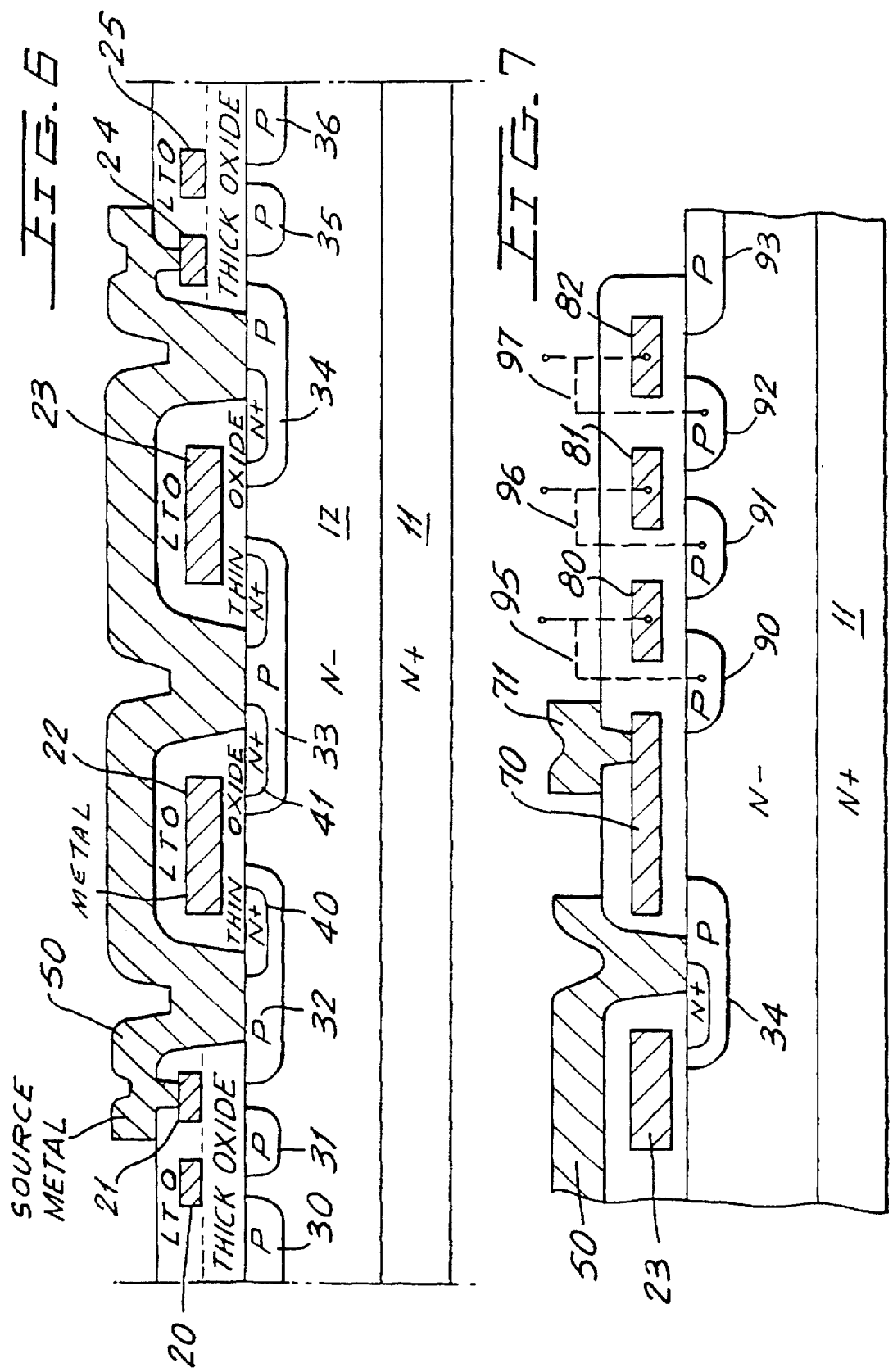

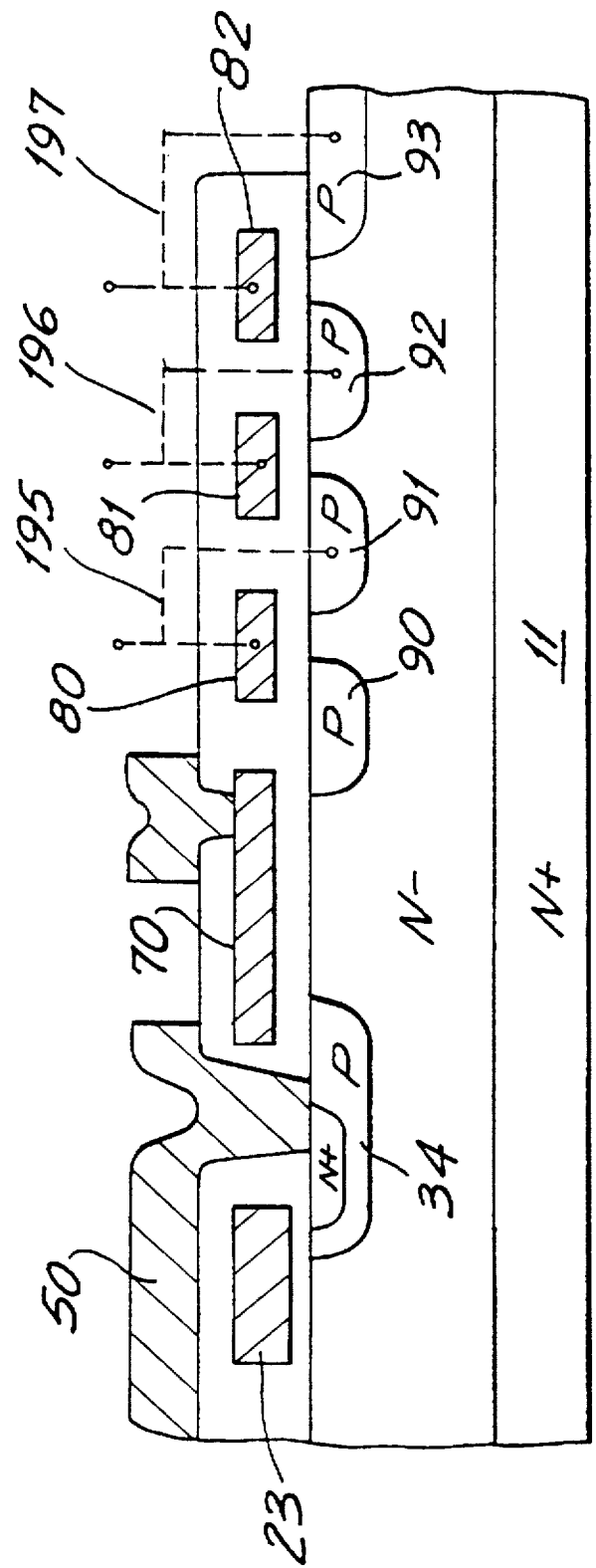

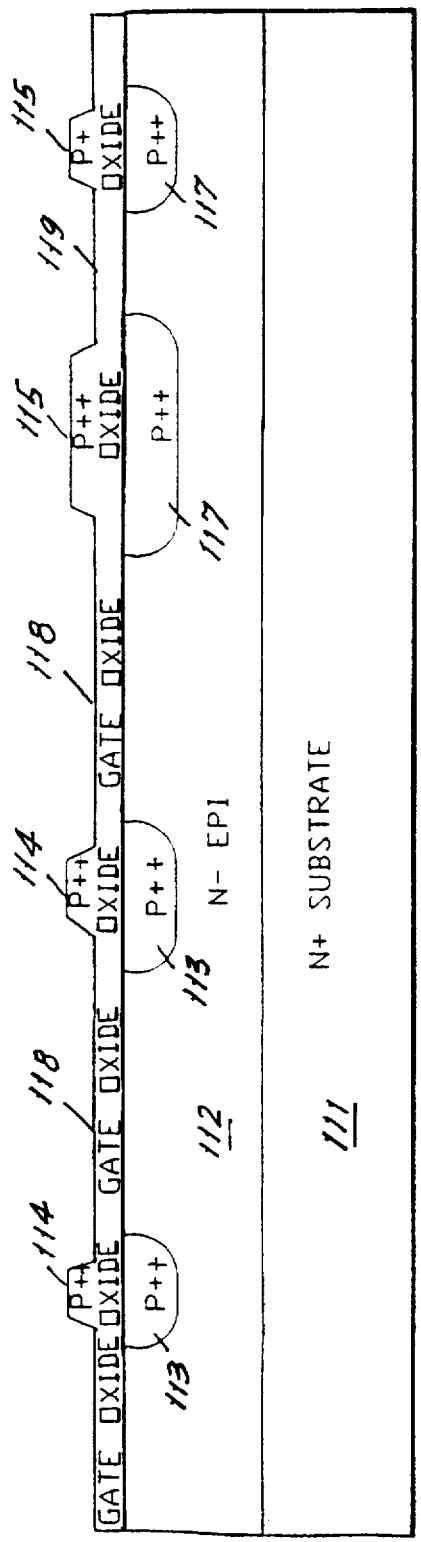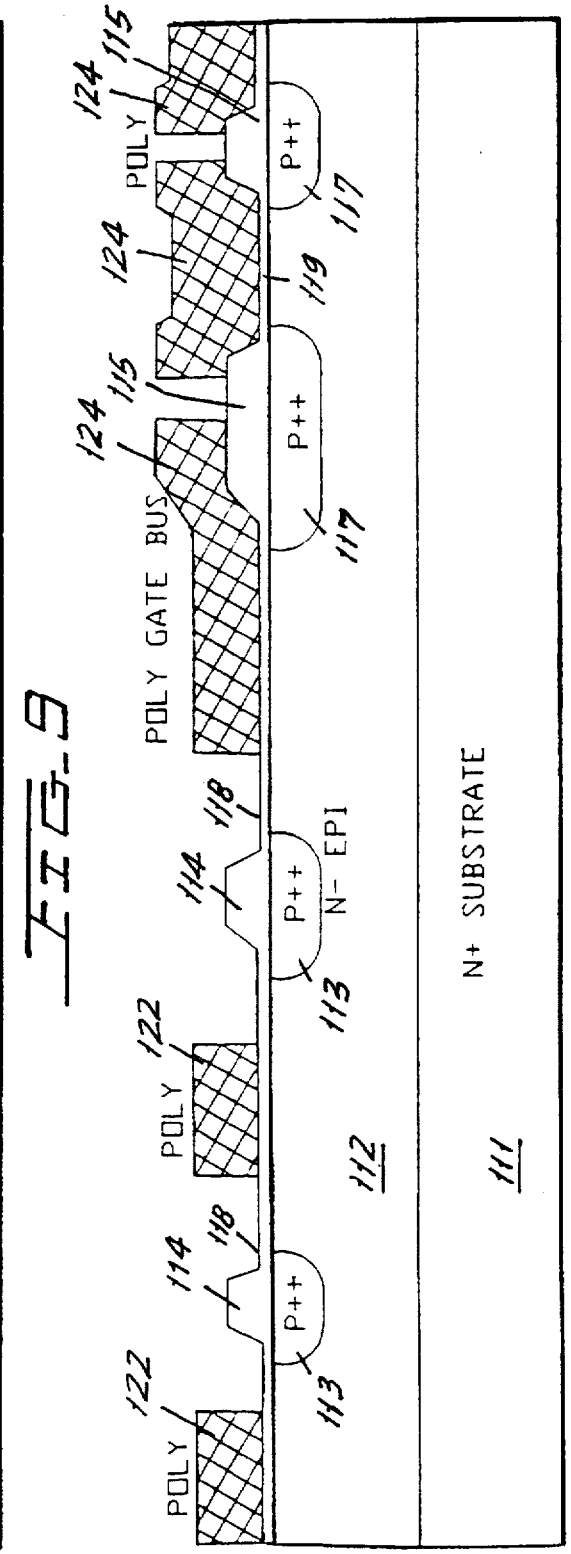

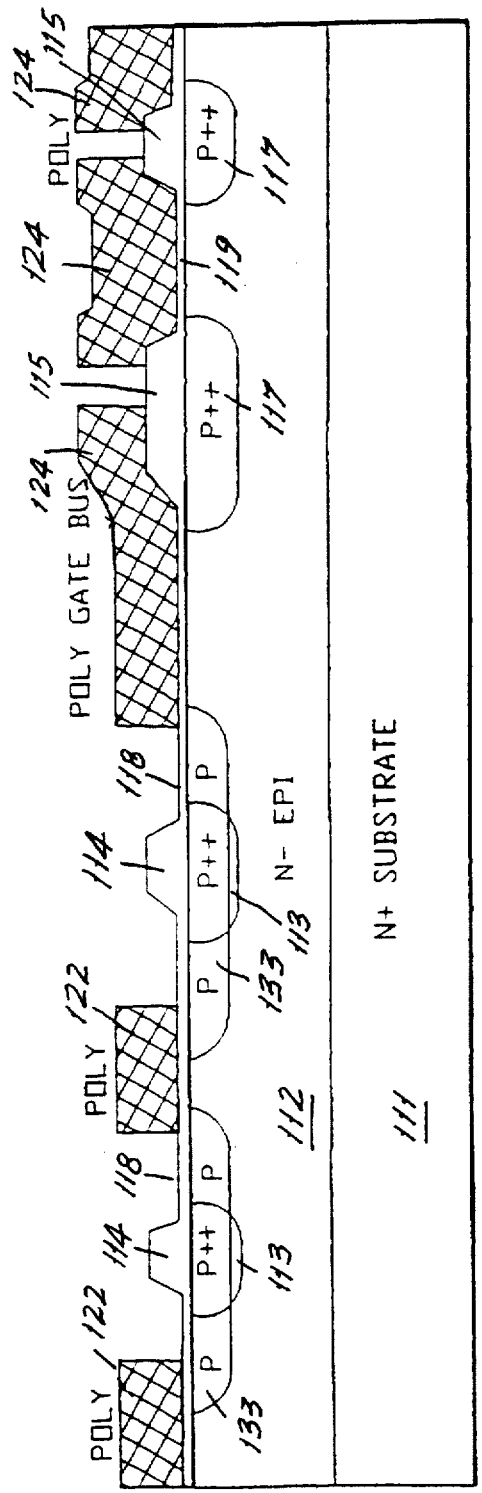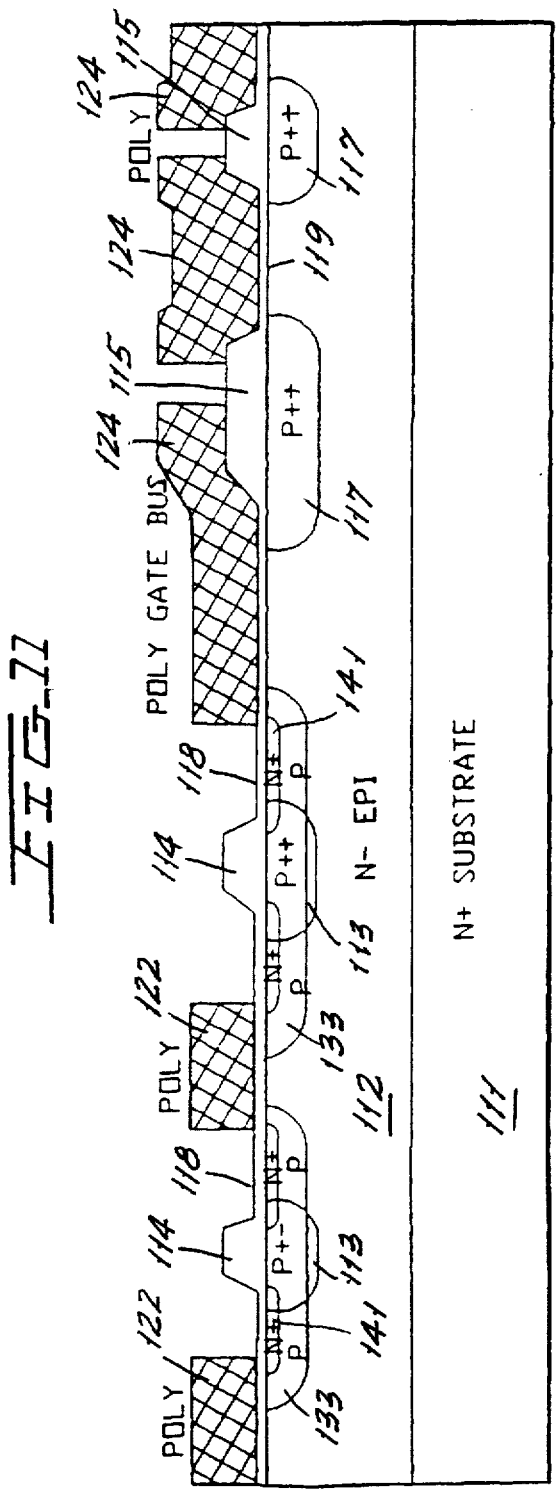

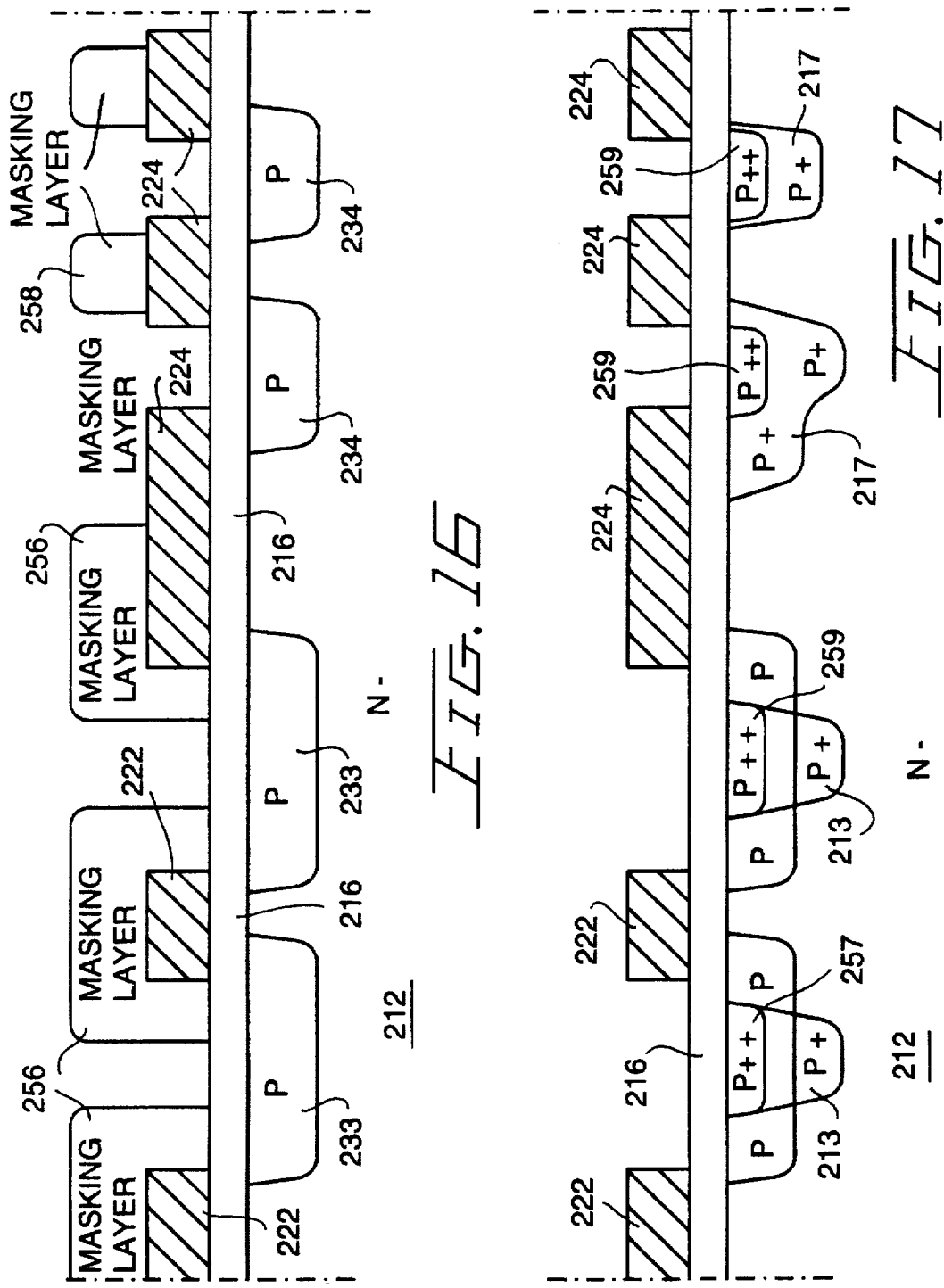

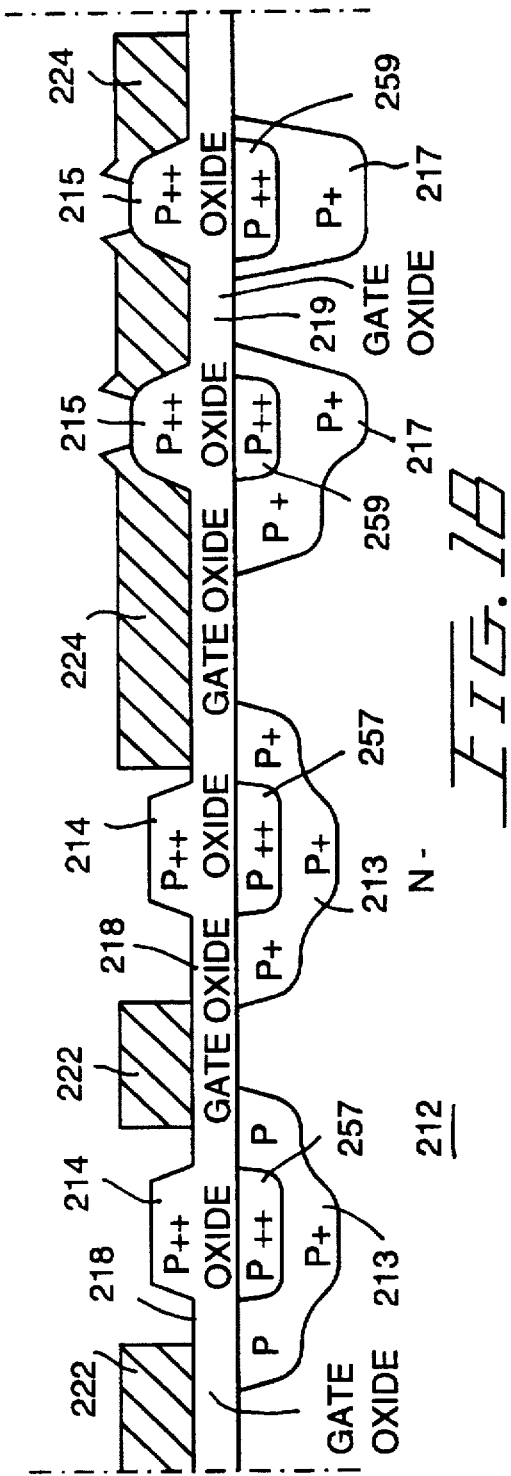
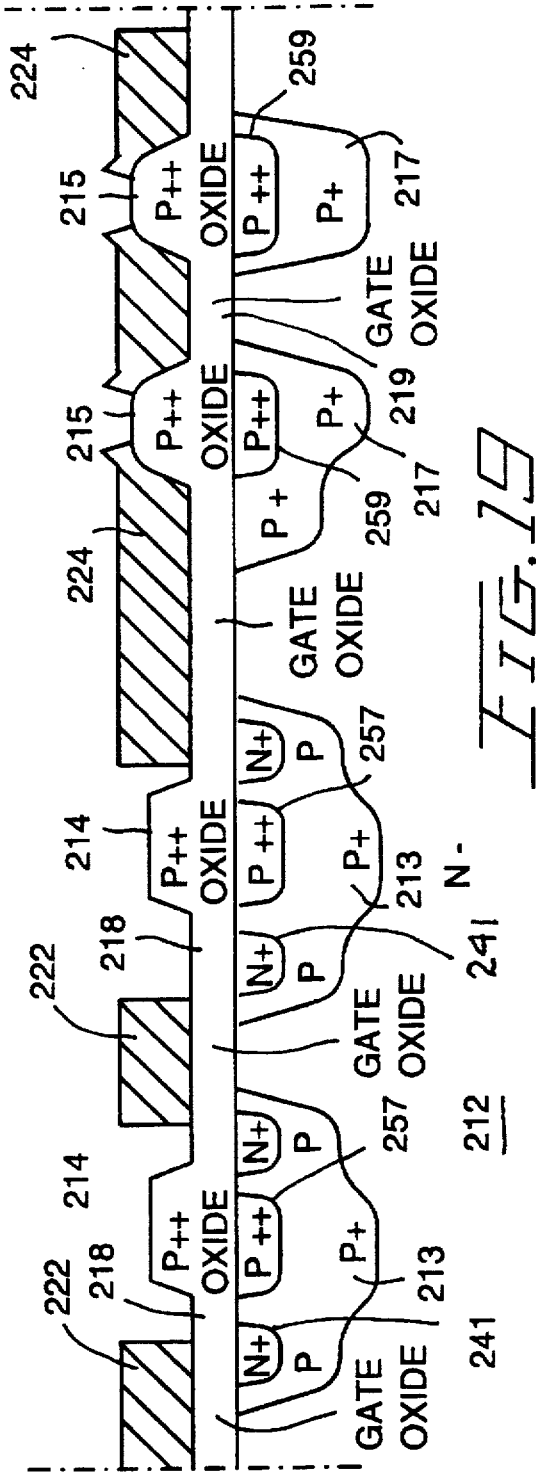

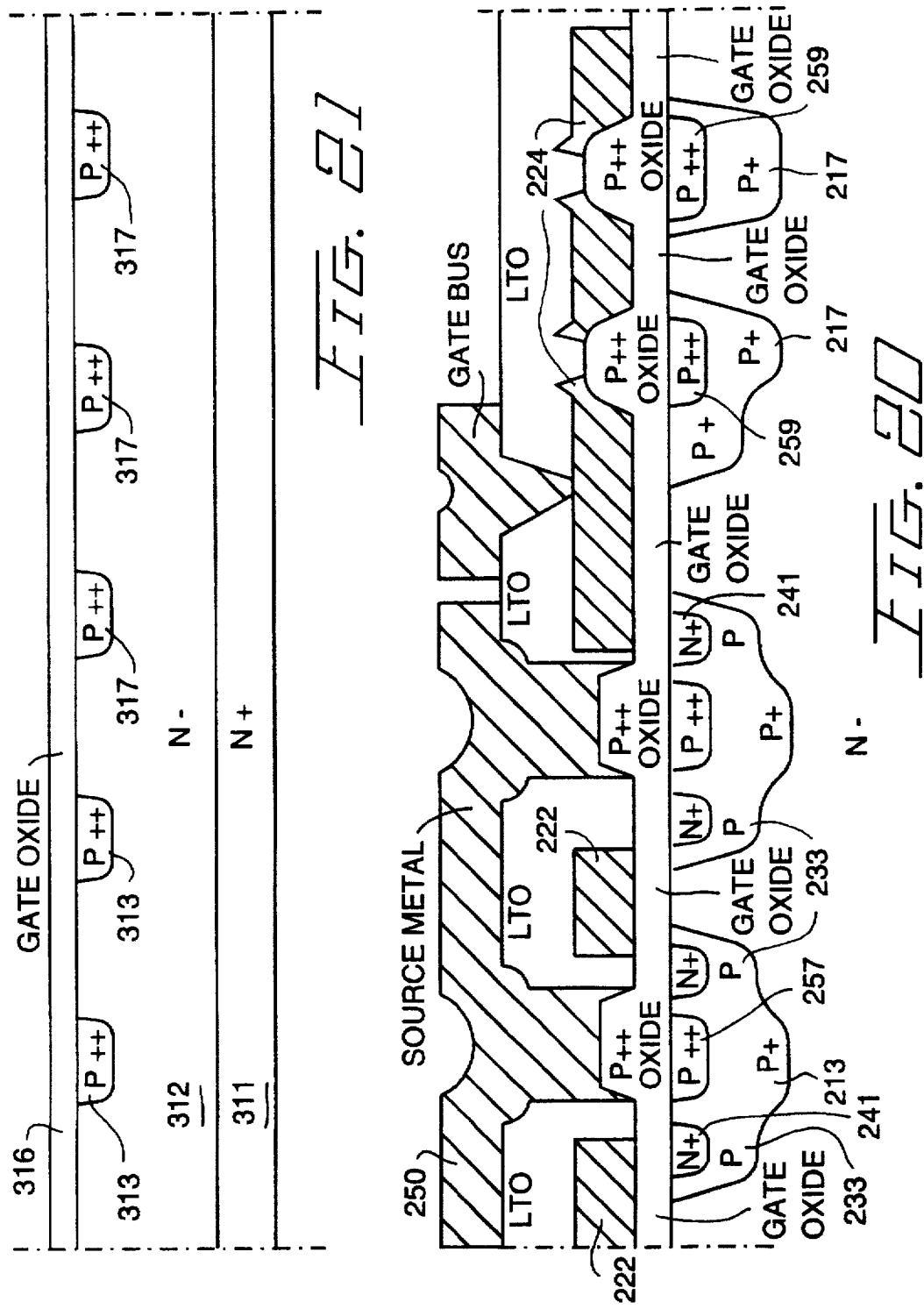

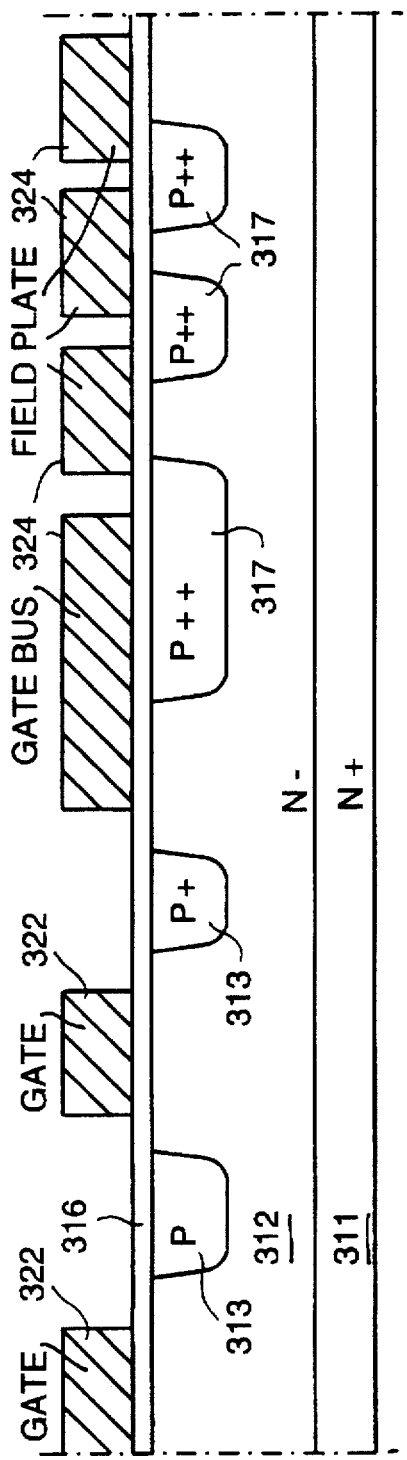
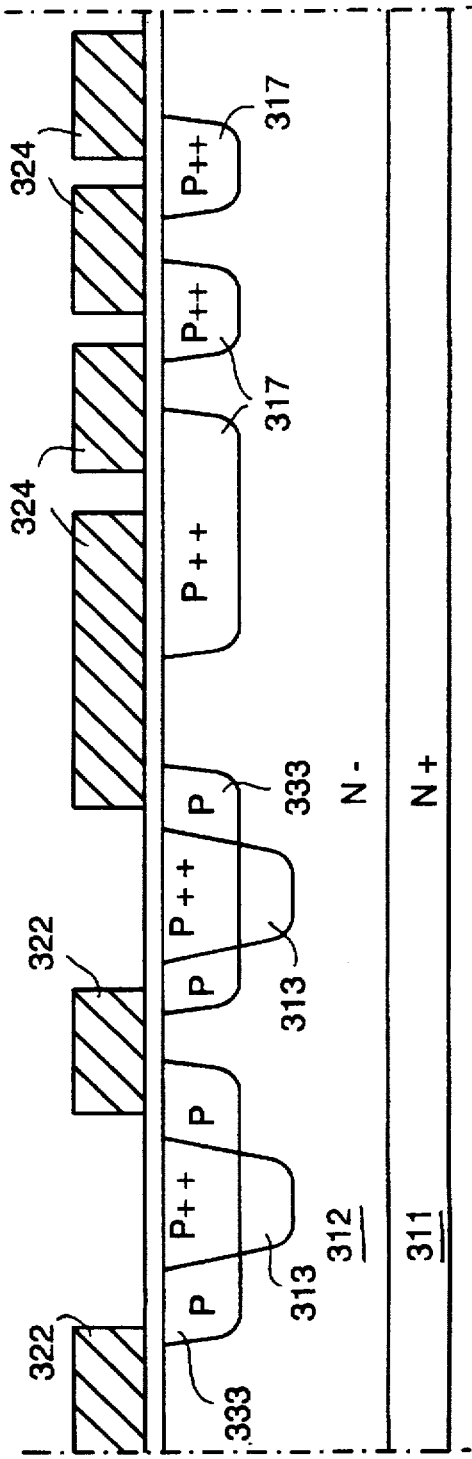

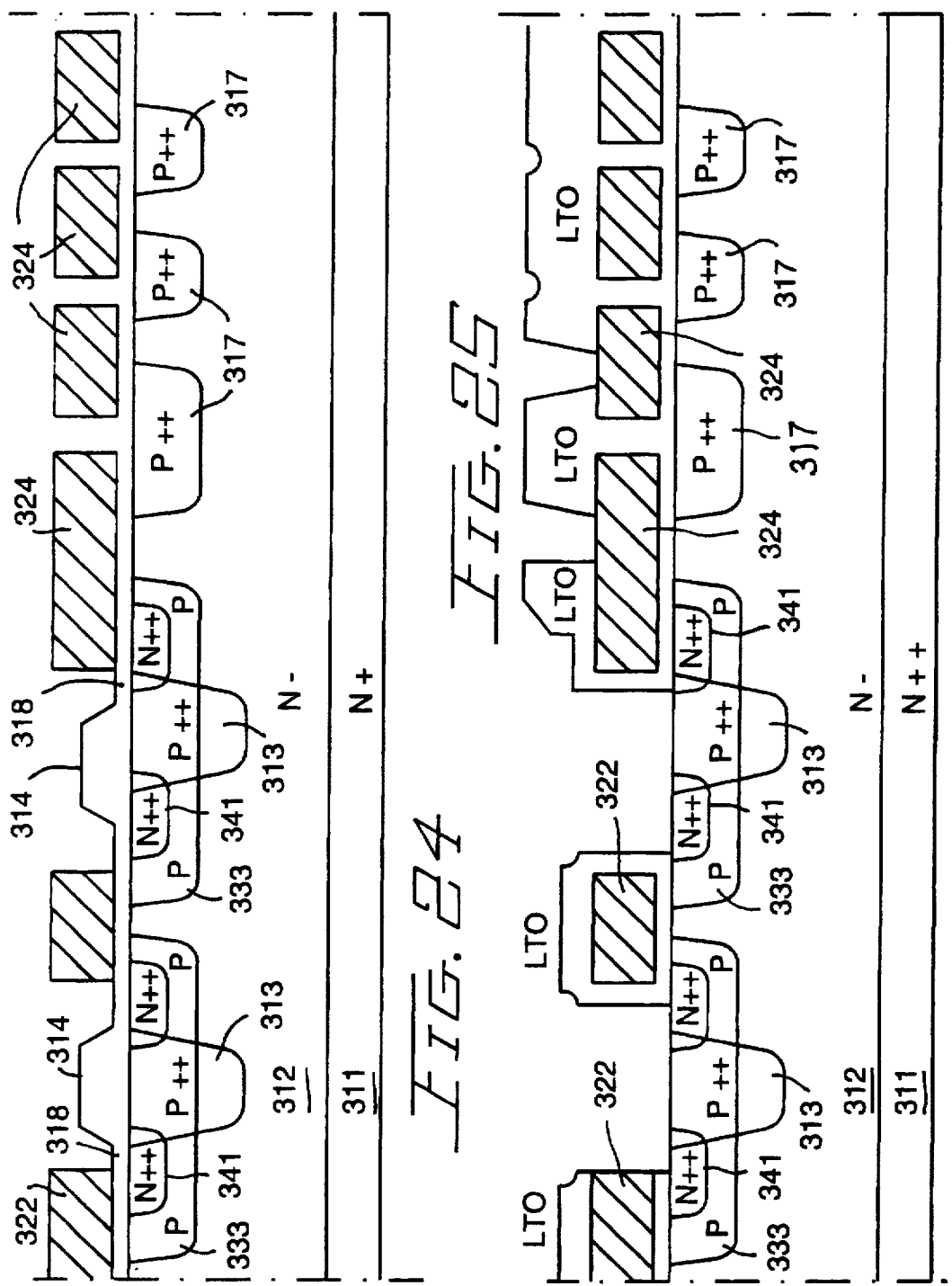

REDUCED MASK PROCESS FOR MANUFACTURE OF MOS GATED DEVICES USING DOPANT-ENHANCED-OXIDATION OF SEMICONDUCTOR

RELATED APPLICATIONS

This application is a continuation-in-part of application Ser. No. 08/390,099, filed Feb. 17, 1995, now U.S. Pat. No. 5,474,946, and is related to copending application Ser. No. 08/299,533, filed Sep. 1, 1994, entitled PROCESS FOR MANUFACTURE OF MOS gated DEVICE WITH REDUCED MASK COUNT and application Ser. No. 08/409,347, filed Mar. 23, 1995, entitled TERMINATION STRUCTURE FOR MOS GATED DEVICE WITH REDUCED MASK COUNT AND PROCESS FOR ITS, now U.S. Pat. No. 5,557,127, all of which are assigned to the assignee of the present invention. The disclosures of these related applications are herein incorporated by reference.

BACKGROUND OF THE INVENTION

This invention relates to MOS gated devices, and more specifically relates to a novel process which exploits the different implantation ranges of certain N and P impurities to produce a junction pattern with fewer mask steps and only two critical mask alignments.

MOS gated devices, such as power MOSFETs, Insulated Gate Bipolar Transistors (IGBTs) and MOS gated thyristors are well known. The process used for the manufacture of these devices employs a sequence of masking steps in which many of the masks must be carefully and critically aligned with respect to one another. Each mask layer in a process increases manufacturing expense, and each mask step introduces a new possible source of defects. Moreover, the requirement of aligning several masks with critical accuracy relative to one another also adds manufacturing costs and introduces the possibility of additional manufacturing defects.

A process for manufacturing such devices which employs a reduced number of masks, and a reduced number of critical alignments between masks is desirable since it reduces wafer handling, potential defects and the cost of the individual chips in a wafer.

SUMMARY OF THE INVENTION

In accordance with an earlier embodiment of the invention, described and claimed in parent U.S. Pat. No. 5,474,946 and shown in FIGS. 1–8 herein, an oxide layer, having adjacent thin and thick regions is formed in a first masking step. A critically aligned patterned polysilicon layer is formed in a second masking step to accurately deposit polysilicon layers in predefined regions of the thin oxide, which becomes the gate oxide of a MOS gated device. A first species is then implanted through both the thin and the thick oxide exposed by the patterned polysilicon so as to form spaced base regions. A second species is next implanted at an energy sufficient to penetrate only the thinner oxide regions exposed between the edges of the polysilicon and the edges of the thicker oxide, but not the exposed thicker oxide, to form source regions within the bases with critical alignment. After the base regions and source regions are formed as described above, a mask step which defines contact windows in a low temperature oxide which covers the wafer surface is carried out. This mask is critically aligned with the polysilicon mask.

Note that this process has only two critical alignment masking steps as described above. The first is the alignment of the polysilicon mask to the prior mask which defined the thin and thick oxide regions. The second is the alignment of the contact window mask to the prior polysilicon mask.

A plurality of series-connected PMOS devices can be formed during the process steps described above to form a termination surrounding the device active area in a manner described in U.S. Pat. No. 5,557,127.

More specifically, for fabricating semiconductor devices, masks are used to form each of the different layers necessary for the functioning of the semiconductor devices. In the present invention, in effect, a single mask defines two layers. Using a vertical N channel power MOSFET as an example, the vertical N channel power MOSFET consists of basically two diffused regions: a shallow N+ region and a deeper P body region. The range of boron (a P type dopant) in silicon dioxide is about five times that of arsenic (an N type dopant). An oxide thickness of 3000 Å can be penetrated by boron implantation of greater than about 80 KeV while it would mask against arsenic implantation of less than about 120 KeV. In accordance with the invention, this property is used to define both the P body and N+ regions using a single oxide layer and polysilicon mask (eliminating the source mask). The device process then employs a further critical mask for defining all contact regions. This mask and the mask for defining the polysilicon pattern are the only two masks which require a critical, or high-accuracy alignment.

Using the above process, diffusions such as P++ diffusions cannot be formed under the gate polysilicon. This increases the curvature of the depletion layer in regions of the die where the gate polysilicon width is large, such as the gate pad and the gate bus regions. Hence, the breakdown voltage obtained using the above process is about 15% less than that obtained using a standard termination. Furthermore, the above process does not provide a deep P base region, such as disclosed in U.S. Pat. No. 4,642,666, in the active area of the device. In order to overcome these limitations, additional embodiments of the invention are provided in which a portion of the process is modified in a manner which allows the diffusion of P++ regions below the polysilicon at regions of the die where necessary, such as under the gate pad regions, under the gate bus regions, and at the edge of the active area of the device. The additional embodiments of the invention described herein also advantageously permit the formation of deep P++ base regions in the active area of the device.

Specifically, in a second embodiment of the invention, the first step involves forming an oxide layer on the top surface of a silicon wafer, and then patterning the oxide layer in a first mask step to expose openings in the oxide layer. A relatively high concentration of first species atoms is then implanted in the exposed openings in the oxide layer and the implanted first species atoms are diffused through the exposed openings to form at least relatively highly doped region in the silicon wafer in an area exposed by the pattern.

Next, in the second embodiment of the invention, the oxide layer is etched away completely, and another oxide insulation layer is thermally grown over the surface of the silicon wafer. The oxide grows thicker over the regions of the semiconductor surface which have been doped with the relatively high concentration of first species atoms, thereby defining first insulation areas, disposed over the relatively highly doped semiconductor regions, which are relatively thicker than second insulation areas adjacent to the first insulation areas.

The subsequent steps of the process are the same as that of the first embodiment, yielding a device with a similar structure to that of the first embodiment, but with a relatively highly doped regions disposed beneath the polysilicon at regions of the die where necessary, such as under the gate pad, under the gate bus and at the edge of the active area of the die, thereby obtaining a structure with close to standard termination breakdown voltage. Additionally, deep base regions in the active area of the device are formed, which are further advantageous from the standpoint of breakdown voltage.

In the process of the third embodiment of the invention, an insulation layer is first grown on the silicon surface and the polysilicon is then deposited and patterned on the insulation layer using a masking step. First species atoms are then implanted through the openings in the patterned polysilicon to form base regions.

Next, a masking layer is formed and patterned to expose openings into which relatively highly doped second species atoms are introduced to form relatively highly doped deep regions. Preferably, multiple implantations of the second species atoms are performed, including: (i) a first implant of the second species atoms at a sufficiently high energy to penetrate the patterned polysilicon layer to form regions of the second species atoms under the patterned polysilicon layer; and (ii) a second implant of the second species atoms of a sufficiently high dose to enhance the doping concentration of regions of the second species atoms near the surface of the wafer in the active area of the device.

Next, the masking layer is etched away and another oxide insulation layer is thermally grown over the surface of the silicon wafer. The oxide grows thicker over the regions of the semiconductor surface which have been doped with the relatively high concentration of second species atoms, thereby defining first insulation areas, disposed over the relatively highly doped semiconductor regions, which are relatively thicker than second insulation areas adjacent to the first insulation areas. Third species atoms are implanted through this additional insulation layer at an energy sufficient to significantly penetrate the second insulation areas but not significantly penetrate the first insulation area or the polysilicon, thereby forming source regions in the base regions, after which a source contact is formed.

The above described third embodiment has the advantages of the second embodiment in that it allows the formation of P+ regions under the polysilicon. Advantageously, the third embodiment also provides deep P+ base regions.

In the process of the fourth embodiment of the invention, the relatively highly doped base regions are formed first, then the polysilicon is deposited and patterned, and the base regions are formed using the patterned polysilicon as a mask. Next, an oxide insulating layer is grown which, as in the above embodiments, grows thick over the highly doped areas of the base regions, and, as before, the source regions are formed by implantation using the thick oxide as a mask.

Other features and advantages of the present invention will become apparent from the following description of the invention which refers to the accompanying drawings.

BRIEF DESCRIPTION OF THE DRAWINGS

FIG. 4 shows the wafer portion of FIG. 3 following the implant of the source region through the exposed thin oxide only, to form source regions following the anneal of those regions.

FIG. 5 shows the wafer portion of FIG. 5 following the deposition of an oxide interlayer and the formation of contact windows by a mask which is aligned with critical accuracy to the polysilicon mask.

FIG. 6 shows the wafer portion of FIG. 5, following the deposition of the source metal, and the patterning of the source metal by a non-critical mask step.

FIG. 7 shows the use of series-connected PMOS devices as a termination for the device disclosed.

FIG. 8 shows the use of floating-field rings with field plates as a termination for the device disclosed.

FIG. 9 is a cross-sectional view of a small portion of a wafer in a second embodiment of the invention after a first masking step to define P++ implantation regions, after implantation of the P++ regions through the openings in a masking oxide formed by the first masking step, and after the masking oxide has been etched down completely and a thermal oxide has been grown over the surface of the wafer.

FIG. 10 shows the wafer portion of FIG. 9, following a second mask used to pattern a polysilicon layer with a critical alignment to the first mask.

FIG. 11 shows the wafer portion of FIG. 10 after an implant of P base regions through exposed thick and thin oxide regions and the drive of the P base regions.

FIG. 12 shows the wafer portion of FIG. 11 following the implant of source regions through the exposed thin oxide only, to form source regions following the anneal of those regions.

FIGS. 14–20 show the sequential process steps of a third embodiment of the invention.

FIGS. 21–26 show the sequential process steps of a fourth embodiment of the invention.

DETAILED DESCRIPTION OF THE PREFERRED EMBODIMENTS

Figure 1:
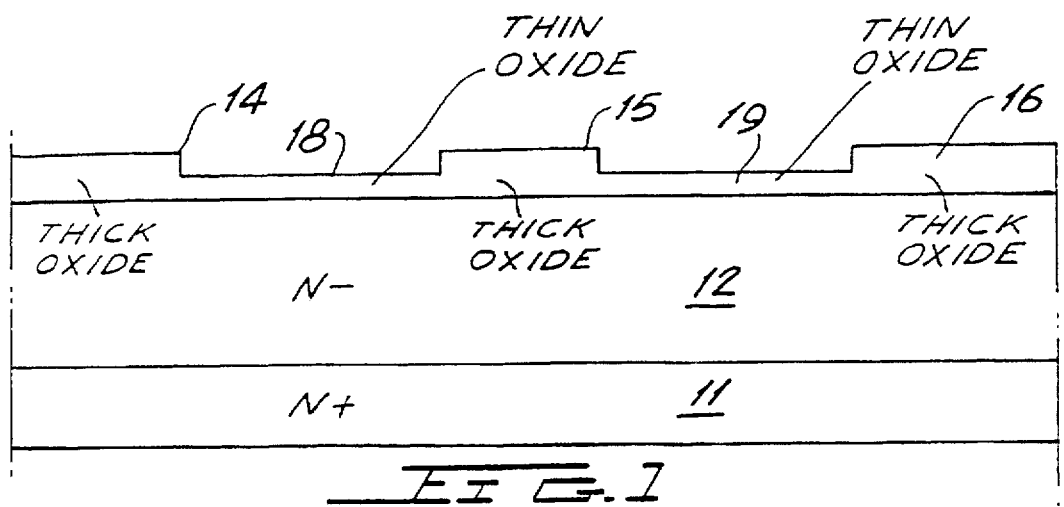
FIG. 1 is a cross-sectional view of a small portion of a wafer after a first masking step and the definition of a pattern of thin and thick oxides.

Referring first to FIG. 1, there is shown a small portion of a monocrystalline wafer 10 having a relatively thick substrate portion 11 and a relatively thin epitaxially deposited portion 12. Regions 11 and 12 are shown as N type for the manufacture of an N channel device, but the conductivity types can be reversed to form a P channel device.

The present invention can also be used in connection with any desired device topology, such as a cellular topology, as disclosed in U.S. Pat. No. 5,008,725 or interdigitated topology, as shown in U.S. Pat. No. 4,376,286. Further, the invention can be used for the manufacture of any desired type of MOS gated device, such as power MOSFETs, IGBTs, MOS gated thyristors, and the like.

In the embodiment disclosed, an N channel power MOSFET of interdigitated topology is disclosed. In FIG. 1, a thick oxide layer, of thickness of about 3000 Å, is first grown atop the epitaxial layer 12. This oxide is then coated with a photoresist, the resist is patterned with a first mask pattern (not shown) and the thick oxide is etched forming thick, spaced, parallel strips 14, 15 and 16. Any number of strips 14, 15 and 16 can be used and they may extend around predetermined parallel paths. These regions may also have the shapes of spaced closed polygons.

Thin oxide strips 18 and 19 are then regrown on the exposed silicon surface to a thickness, for example, of 500 Å. These regions 18 and 19 are between thick regions 14–15 and 15–16, respectively. Portions of regions 18 and 19 will ultimately define the gate oxide for the device. The thick and thin regions can have other thicknesses than 3000 Å and 500 Å respectively, and their thicknesses are selected based on the desired gate characteristics, the ion species to be implanted to form P and N regions and the implant energy to be used.

Figure 2:
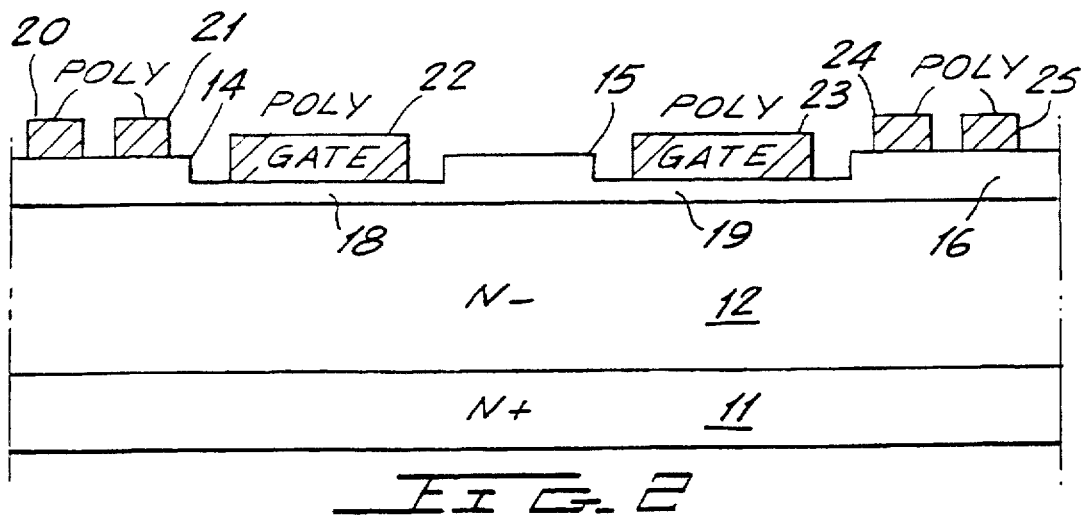
FIG. 2 shows the wafer portion of FIG. 1, following a second mask used to pattern a polysilicon layer with a critical alignment to the first mask.

Thereafter, a layer of polysilicon is grown atop the surface of the device as shown in FIG. 2 and a photoresist is deposited thereon and is patterned by a second mask which is critically, (very accurately) aligned to the first mask which defined the location of the thick and thin regions 14, 15, 16, 18 and 19. The polysilicon is then etched, leaving strips 20, 21, 22, 23, 24 and 25 in place. Strips 22 and 23 are gates for the MOS gated devices being made and are accurately located centrally atop thin gate oxide regions 18 and 19, defining gaps approximately 2 microns from the sides of each of the adjacent thick oxide regions and 5 microns wide.

Polysilicon strips 20–21 and 24–25 are spaced apart by a gap of about 3 microns. Strips 20, 21, 24 and 25 and other adjacent strips, not described will define guard rings and diffusions, as will be shown later.

Figure 3:
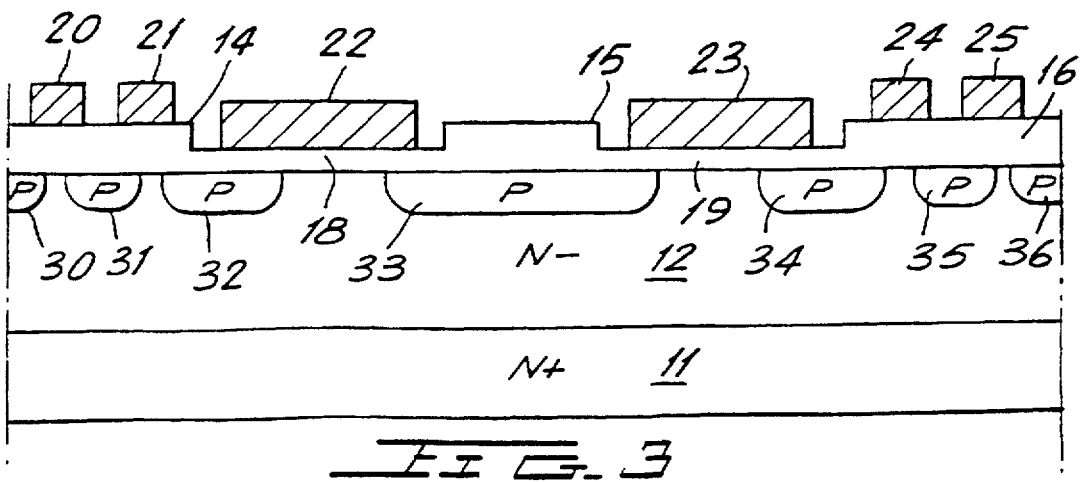
FIG. 3 shows the wafer portion of FIG. 2 after an implant of a base region through exposed thick and thin oxide regions and the drive of the device base regions.

Thereafter, as shown in FIG. 3, a boron implant is carried out, using the polysilicon strips 20 to 25 as a mask, at an energy sufficient to penetrate both the thin and thick exposed oxide layers 14, 15, 16, 18 and 19. For example, boron implantation at an energy of about 80 KeV or higher can be used at a dose of $7E13 cm^{-2}$. Species other than boron could alternately be selected. The energy used for the implant is determined, in part, by the thickness of the thick oxide. This implant is followed by a drive at 1175° C. shown in FIG. 3 for 30 minutes to form the P type regions 30 to 36. Note that regions 30, 31, 35 and 36 are sections through guard rings which terminate active base regions 32 and 34.

Thereafter, and as shown in FIG. 4, arsenic is implanted into the silicon surface, using the same polysilicon strips 20 to 25 as masks. The energy selected for the arsenic implant (or any other species selected) is sufficient to penetrate the thin exposed gate oxide layers 18 and 19, but it is blocked by the thicker exposed oxide regions. Arsenic, at an energy of 80 KeV and a dose of 1E16, reaches the underlying silicon and forms N+ source strips 40, 41, 42 and 43 in the bases 32, 33 and 34.

As next shown in FIG. 5, a layer of low temperature oxide (LTO) 50 is deposited atop the wafer of FIG. 4 to a thickness of about 7000 Å. The LTO is then patterned in a second critical masking step (relative to the polysilicon mask) to form contact windows 60 to 64. Windows 60 and 64 expose the surfaces of rings 21 and 24, windows 61 and 63 expose the surfaces of P regions 32 and 34, respectively, and sources 40 and 43, respectively, and window 62 exposes the surfaces of base 33 and sources 41 and 42.

Note that if the topology of the device of FIG. 5 is chosen to be ring-shaped, base 33 may have a polygonal shape, with sources 41 and 42 being sections through a single annular source, and with bases 32 and 34 being sections through a single base which is concentric with base 33, and with rings 31 and 35 being sections through a single ring also concentric with base 33.

Thereafter, and as shown in FIG. 6, a source metal 52 is deposited atop the surface of FIG. 5 to make contact to rings 21 and 24 which terminate the active area of the device and to base regions 32, 33 and 34 and their sources 40, 41–42 and 43, respectively. Thereafter, a metal pattern is defined, using a fourth, but non-critical mask step.

FIG. 7 shows the use of a plurality of series connected PMOS devices which can be used to terminate the active area of the device of FIG. 6 in the manner shown in U.S. Pat. No. 5,557,127. These rings are formed during the same steps which are used to form the active area of the devices.

Thus, in FIG. 7, a polysilicon field plate 70 which may encircle the active area is formed during the polysilicon etch step. A gate bus 71 is attached to plate 70 which plate is continuous with the full polysilicon gate area in the active device. Polysilicon rings 80, 81 and 82 can be also formed during the polysilicon etch step for the active device. P type rings 90 to 93 are diffused during the step of FIG. 3 and are defined by polysilicon patterns 70, 80, 81 and 82. Small contacts, schematically shown by dotted lines 95, 96 and 97 connect P regions 90, 91 and 92 to gates 80, 81 and 82 of the 3 PMOS devices shown, shorting the source and gate electrodes of each PMOS device in the manner disclosed in copending application Ser. No. 08/409,347, filed Mar. 23, 1995. Thus, the threshold voltages of the 3 PMOS devices are connected in series to terminate the device. Any desired number of PMOS devices can be used, as required by the voltage to be terminated.

The arrangement of FIG. 7 shows a termination structure in which the rings or strips 90, 91 and 92 are shorted to limit voltage to the device threshold voltages. FIG. 8 shows another termination structure in which each of polysilicon rings 80, 81 and 82 is shorted to the next P ring 91, 92 and 93 respectively to its right, limiting the voltage to the punch-through voltage between P rings and biasing the PMOS devices off. Small contacts, schematically shown in FIG. 8 by dotted lines 195, 196 and 197, connect P regions 91, 92 and 93 to polysilicon field rings 80, 81 and 82. A combination of the above two termination structures can also be used.

The shorting contacts used are preferably only sparsely spaced around the rings and the contact positions are defined during the contact opening mask step. Thus, as shown in U.S. Pat. No. 5,557,127, small area contacts 95, 96 and 97 may be located in a corner of a rectangular chip. The small area contacts 95, 96 and 97 may be separated from the source metal during the metal mask step.

The above process is advantageous in reducing the number of critical mask steps as discussed above. However, the above process has the disadvantage that diffusions, such as P+ diffusions, cannot be formed under the gate polysilicon. Hence, the breakdown voltage obtained using the above process is about 15% less than that obtained using a standard termination. In order to overcome this limitation, a second embodiment of the invention is provided in which the a portion of the process of the first embodiment is modified in a manner which allows the diffusion of a P+ region below the polysilicon.

Specifically, referring to FIG. 9, there is depicted again a small portion of a silicon wafer 110 having a relatively thick substrate portion 111 and a relatively thin epitaxially deposited portion 112. As in the first embodiment, regions 111 and 112 are shown as N type for the manufacture of an N channel device, but the conductivity types can be reversed to form a P channel device. Additionally, as in the first embodiment, the device formed by the process of the second embodiment can be of any desired device topology, such as a cellular topology or interdigitated topology, and can be used for the manufacture of any desired type of MOS gated device, such as power MOSFETs, IGBTs, MOS gated thyristors, and the like.

With continuing reference to FIG. 9, in the process of the second embodiment, a thick oxide layer (not shown), preferably of thickness of about 1 µm, is first grown atop the epitaxial layer 112. This oxide is then coated with a photoresist, the resist is patterned with a first mask pattern (not shown) and the thick oxide is etched in selected areas to form windows for implantation of P++ regions 113 and P++ termination regions 117. A relatively high concentration of boron with a dose in the range of $3 \times 10^{16}$ cm$^{-2}$ is preferably used as the dopant to form the P++ regions 113, 117, as shown in FIG. 9. Multiple high dose boron implants can be used to enhance the surface doping concentration of the P++ regions. The thick oxide is then blanket etched completely off the silicon surface.

Next, a thermal insulating oxide (silicon dioxide) is grown on the silicon surface. Referring still to FIG. 9, the oxide grows thicker over the regions of the semiconductor surface which have been relatively highly doped with boron, i.e. over the P++ regions, yielding an oxide insulation layer having thick regions 114, 115, preferably having a thickness of between about 700 Å to 2000 Å, and thin regions 118, 119, preferably having a thickness of between about 500 Å to 1000 Å (or having thick and thin strips if an interdigitated topology is employed).

Referring to FIGS. 10–13, the subsequent steps of the process of the second embodiment are the same as that of the first embodiment, wherein like elements are indicated by corresponding reference numerals.

More specifically, FIG. 10 shows the wafer portion of FIG. 9, following a second mask used to pattern a polysilicon layer 122, 124 with a critical alignment to the first mask. FIG. 11 shows the wafer portion of FIG. 10 after an implant of P base regions 133 through exposed thick oxide 114 and thin oxide 118 regions and the drive of the P base regions 133 (preferably using boron at the same energy and dose as in the process of the first embodiment).

FIG. 12 shows the wafer portion of FIG. 11 following the implant of the source regions 141 mainly through the exposed thin oxide 118, and the anneal of those regions (preferably with arsenic and again at the same energy and dose as in the process of the first embodiment). The small portion of source implant dose which may penetrate the P++ oxide regions 114 and 115 is not sufficient to compensate for the very heavily doped P++ regions.

Figure 13:
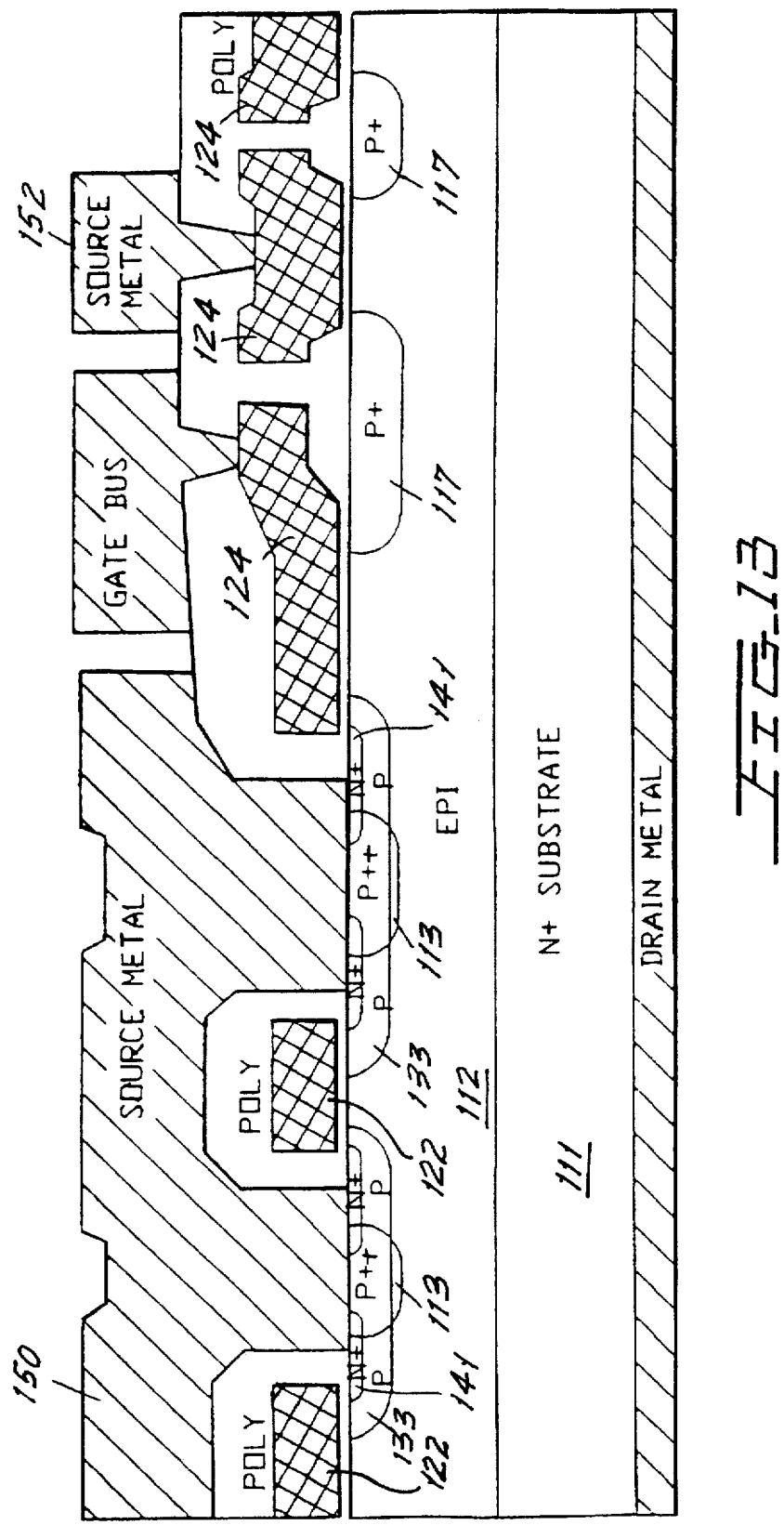
FIG. 13 shows the wafer portion of FIG. 12 following the deposition of an oxide interlayer, the formation of contact windows by a mask which is aligned with critical accuracy to the polysilicon mask, the deposition of the source metal, and the patterning of the source metal by a non-critical mask step.

Finally, FIG. 13 shows the wafer portion of FIG. 12 following the deposition of an oxide interlayer, the formation of contact windows by a mask which is aligned with critical accuracy to the polysilicon mask, the deposition of the source metal 150, 152 and the patterning of the source metal 150, 152 by a non-critical mask step.

The result of the process described above and shown in FIGS. 9–13 is a device with a similar structure to that of the first embodiment, but with a relatively highly doped (i.e. P++) regions 117 disposed beneath the polysilicon 124 under the gate pad, the gate bus and at the edge of the active device area, thereby obtaining a structure with close to standard termination breakdown voltage.

Figure 14:
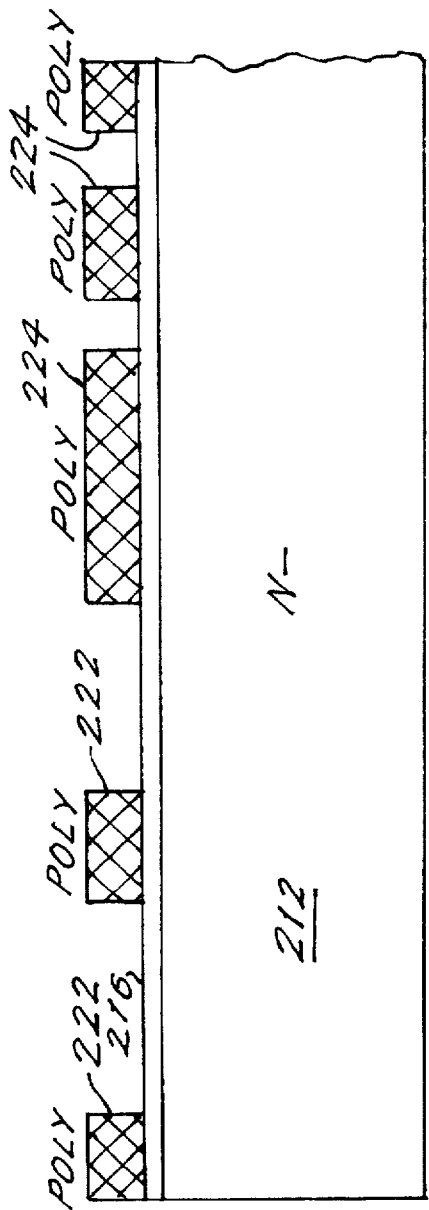
Figure 15:
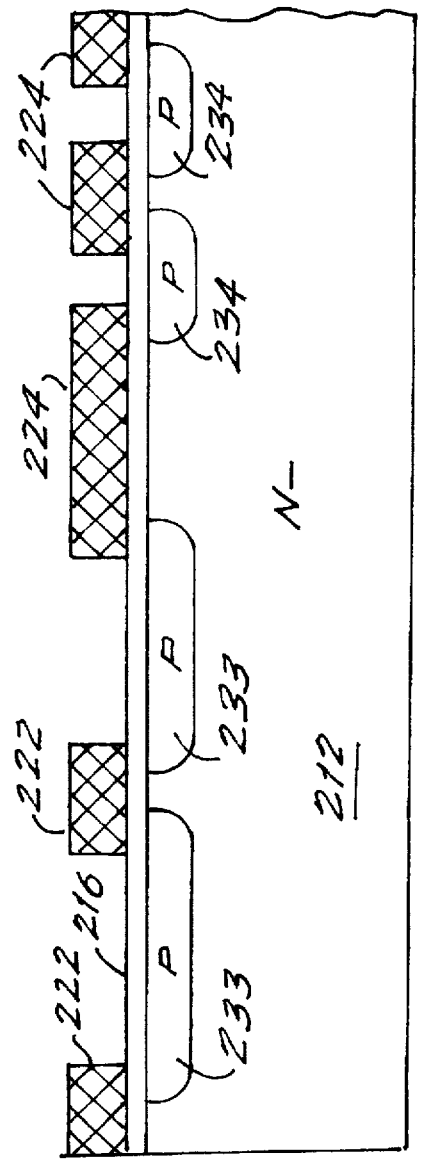

A third embodiment of the invention is shown in FIGS. 14–20, wherein again like elements are indicated by corresponding reference numerals. Referring first to FIG. 14, an insulation layer 216 is first grown on the silicon surface and polysilicon is then deposited and patterned on the insulation layer by a masking step to form polysilicon islands 222, 224. Then, as shown in FIG. 15, boron is then implanted through the openings in the patterned polysilicon to form base regions 233, 234.

Next, as shown in FIG. 16, a masking layer (e.g. photoresist) 256, 258 is formed and patterned by a masking step to expose openings into which relatively highly doped boron or another element of the same conductivity type is introduced to form relatively highly doped deep P+ base regions 213, 217. Referring to FIG. 17, multiple implantations of boron are preferably performed, including: (i) a first implant of boron at a sufficiently high energy to penetrate the patterned polysilicon layer and to form P+ regions 213, 217; and (ii) a second implant of boron at a sufficiently high dose to enhance the doping concentration of P+ regions 213, 217 near the surface of the wafer in an active area of the device to form P++ regions 257, 259.

Next, as shown in FIG. 18, the masking layer 256, 258 is etched away and another oxide insulation layer is thermally grown over the surface of the silicon wafer. The oxide grows thicker over the regions of the semiconductor surface which have been relatively highly doped, i.e. P++ regions 257, 259, thereby defining thick oxide areas 214, 215, disposed over P++ regions 257, 259, and relatively thin oxide areas 218, 219. Referring to FIG. 19, arsenic atoms are implanted through this additional insulation layer at an energy sufficient to penetrate the thin oxide areas 218, but not the thick oxide areas 214, 215, thereby forming source regions 241 in the base regions. Finally, FIG. 20 shows the wafer portion of FIG. 19 following the deposition of an oxide interlayer, the formation of contact windows by a mask which is aligned with critical accuracy to the polysilicon mask, the deposition of the source metal 250 and the patterning of the source metal 250 by a non-critical masking step.

The above described third embodiment has the advantages of the second embodiment in that it allows the formation of P+ regions under the polysilicon. Advantageously, the third embodiment also provides deep P+ base regions 213, 217 and, additionally, shallow P++ regions 257 in the active area of the device.

Figure 26:
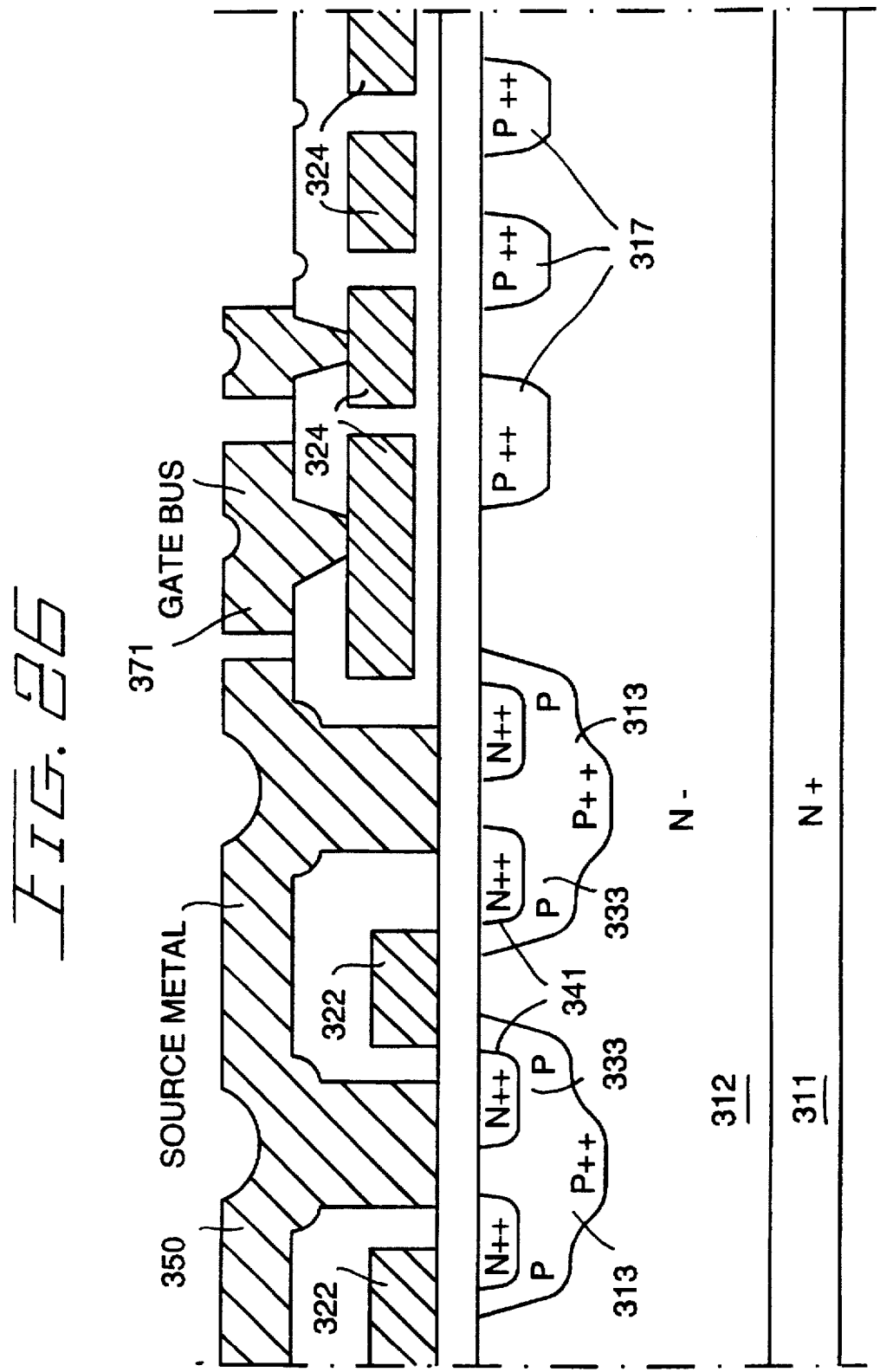

In the process of a fourth embodiment of the invention, shown in FIGS. 21–26 (again, wherein like elements are indicated with corresponding reference numerals), P++ regions 313, 317 are formed first (FIG. 21), then polysilicon 322, 324 is deposited and patterned (FIG. 22), and P base regions 333 are formed using the patterned polysilicon as a mask (FIG. 23). Next, an oxide insulating layer 314, 318 is grown which, as in the above embodiments, grows thick over the highly doped areas of the base regions (FIG. 24), and, as before, the source regions are formed by implantation using the thick oxide as a mask (FIG. 25), followed by metallization (FIG. 26).

Unless otherwise specified herein, the implantation energies, dopant doses, temperatures and other preferred parameters as described in connection with the first embodiment are equally applicable and preferred in the second, third and fourth embodiments of the invention. Additionally, although the invention has been described in connection with an n-channel device, it is equally applicable to the formation of a p-channel device, wherein like elements are formed of opposite conductivity types to those described herein.

The above embodiments describe a process in which the enhanced oxidation rate of silicon implanted with a heavy dose of a species is used to form a thicker oxide layer in regions of silicon implanted with heavy dose of the species (example: boron) compared to regions not implanted with the species.

It is also possible to have an analogous process in which the suppressed oxidation rate of silicon implanted with a species is used to form a thinner oxide layer in regions of silicon implanted with the species (example: nitrogen, ammonia) compared to regions not implanted with the species.

Although the present invention has been described in relation to particular embodiments thereof, many other variations and modifications and other uses will become apparent to those skilled in the art. It is preferred, therefore, that the present invention be limited not by the specific disclosure herein, but only by the appended claims.

What is claimed is:

1. A process for the manufacture of a MOS gated semiconductor device, comprising the steps of:
   (a) forming a masking layer atop a major surface of a silicon wafer;
   (b) patterning said masking layer in a first mask step to expose openings in said masking layer;
   (c) implanting first species atoms in the exposed openings in the masking layer to form at least one region in said silicon wafer doped with said first species atoms;
   (d) etching the masking layer away completely;
   (e) growing an insulation layer over the surface of the silicon wafer to define at least one first insulation area, disposed over said region doped with said first species atoms, which is relatively thicker than at least a second insulation area adjacent to said first insulation area;
   (f) depositing a polysilicon layer atop said insulation layer and patterning said polysilicon layer in a second masking step to cover and mask a third area and to expose a fourth area atop said insulation layer;
   (g) implanting second species atoms through said insulation layer in said exposed fourth area and diffusing said implanted second species atoms through said exposed fourth area to form at least one base region in said silicon wafer;
   (h) implanting third species atoms through said insulation layer in said exposed fourth area at an energy sufficient to penetrate said second insulation area but insufficient to penetrate said first insulation area, thereby to form at least one source region in said at least one base region; and
   (i) thereafter forming a source contact which contacts said at least one source region and said at least one base region.

2. The process of claim 1, in which a plurality of adjacent ones of said first and second insulation areas are formed in said insulation layer, thereby to ultimately define a plurality of adjacent respective ones of said base regions and said source regions.

3. The process of claim 1, wherein said first insulation area has a thickness of between approximately 700 Å–to 2000 Å and said second insulation area has a thickness of between approximately 500 Å–1000 Å.

4. The process of claim 3, in which said first and second atoms are boron and said third species atoms are arsenic.

5. The process of claim 1, in which said first and second species atoms are boron, and said third species atoms are phosphorus.

6. The process of claim 1, wherein a portion of said polysilicon patterned layer overlies a portion of said first insulation area to expose a further area of said first insulation area to define at least one guard ring diffusion in said surface of said silicon wafer during the formation of said at least one base region.

7. The process of claim 1, wherein said masking layer is an oxide layer.

8. A process for the manufacture of a MOS gated semiconductor device, comprising the steps of:
   (a) growing a first insulation layer atop a major surface of a silicon wafer;
   (b) depositing a polysilicon layer atop said first insulation layer and patterning said polysilicon layer in a first masking step to cover and mask a first area and to expose a second area atop said first insulation layer;
   (c) implanting first species atoms through said first insulation layer in said exposed second area and diffusing said implanted first species atoms through said exposed second area to form at least one base region in said silicon wafer;
   (d) forming a masking layer over the surface of the silicon wafer and patterning said masking layer in a second mask step to expose openings in said masking layer;
   (e) implanting second species atoms in the exposed openings in the masking layer to form at least one region in said silicon wafer doped with said second species atoms;
   (f) etching the masking layer away completely;
   (g) growing a second insulation layer over the surface of the silicon wafer to define at least one first insulation area, disposed over said region doped with said second species atoms, which is relatively thicker than at least a second insulation area adjacent to said first insulation area;
   (h) implanting third species atoms through said second insulation layer in said exposed second area at an energy sufficient to penetrate said second insulation area but insufficient to penetrate said first insulation area and said polysilicon layer, thereby to form at least one source region in said at least one base region; and
   (i) thereafter forming a source contact which contacts said at least one source region and said at least one base region.

9. The process of claim 8, in which a plurality of adjacent ones of said first and second insulation areas are formed in said insulation layer, thereby to ultimately define a plurality of adjacent respective ones of said base regions and said source regions.

10. The process of claim 8, wherein said first insulation area has a thickness of between approximately 700 Å–to 2000 Å and said second insulation area has a thickness of between approximately 500 Å–1000 Å.

11. The process of claim 8, in which said first and second species atoms are boron and said third species atoms are arsenic.

12. The process of claim 8, wherein said masking layer is a photoresist layer.

13. The process of claim 8, wherein a portion of said polysilicon patterned layer overlies a portion of said first insulation area to expose a further area of said first insulation area to define at least one guard ring diffusion in said surface of said silicon wafer during the formation of said at least one base region.

14. The process of claim 8, wherein said masking layer is an oxide layer.

15. The process of claim 8, wherein said step (e) comprises multiple implantations of said second species atoms, including:

a first implant of said second species atoms at a sufficiently high energy to penetrate the patterned polysilicon layer to form regions of said second species atoms under the patterned polysilicon layer; and a second implant of said second species atoms of a sufficiently high dose to enhance the doping concentration of regions of said first species atoms near the surface of the silicon wafer in an active area of the device.

16. A process for the manufacture of a MOS gated semiconductor device, comprising the steps of:

(a) growing a first insulation layer atop a major surface of a silicon wafer;

(b) forming a masking layer atop the first insulation layer;

(c) patterning said masking layer in a first mask step to expose openings in said masking layer;

(d) implanting first species atoms in the exposed openings in the masking layer to form at least one region doped with said first species atoms in said silicon wafer;

(e) etching the masking layer away completely;

(f) depositing a polysilicon layer atop said first insulation layer and patterning said polysilicon layer in a second masking step to cover and mask a first area and to expose a second area atop said first insulation layer;

(g) implanting second species atoms through said insulation layer in said exposed second area and diffusing said implanted second species atoms through said exposed second area to form at least one base region in said silicon wafer in an area exposed by said second area;

(h) growing a second insulation layer over the surface of the silicon wafer to define at least one first insulation area, disposed over said relatively highly doped region of first species atoms, which is relatively thicker than at least a second insulation area adjacent to said first insulation area;

(i) implanting third species atoms through said second insulation layer at an energy sufficient to penetrate said second insulation area but insufficient to penetrate said first insulation area, thereby to form at least one source region in said at least one base region; and (j) thereafter forming a source contact which contacts said at least one source region and at said least one base region.

17. The process of claim 16, in which a plurality of adjacent third and fourth insulation areas are formed in said second insulation layer, thereby to ultimately define a plurality of adjacent respective ones of said base regions and said source regions.

18. The process of claim 17, wherein said third insulation area has a thickness of between approximately between approximately 700 Å–2000 Å and said fourth insulation area has a thickness of between approximately 500 Å–1000 Å.

19. The process of claim 16, in which said first and second atoms are boron and said third species atoms are arsenic.

20. The process of claim 16, wherein a portion of said polysilicon patterned layer overlies a portion of said first insulation area to expose a further area of said first insulation area to define at least one guard ring diffusion in said surface of said silicon wafer during the formation of said at least one base region.

21. The process of claim 16, wherein said masking layer is a polysilicon layer.

22. The process of claim 16, wherein said masking layer is a resist layer.

23. The process of claim 1, wherein said step (c) comprises multiple implantations, including:

a first implant of said first species atoms of sufficient dose to enhance the thermal oxidation rate in regions of said first species atoms; and a second implant of said second species atoms.

24. The process of claim 8, wherein said step (e) comprises multiple implantations, including:

a first implant of said first species atoms at a sufficiently high energy to penetrate the patterned polysilicon layer to form regions of said first species atoms under the patterned polysilicon layer; and a second implant of said second species atoms of sufficiently high dose to enhance the thermal oxidation rate in regions of said second species atoms.

25. The process of claim 16, wherein said step (d) comprises multiple implantations, including:

a first implant of said first species atoms of sufficient dose to enhance the thermal oxidation rate in regions of first species atoms; and a second implant of said second species atoms.

* * * * *